(12) United States Patent
Guo et al.

(10) Patent No.: US 9,070,431 B2
(45) Date of Patent: Jun. 30, 2015

(54) MEMORY CIRCUITRY WITH WRITE ASSIST

(71) Applicant: ARM LIMITED, Cambridge (GB)

(72) Inventors: Frank Guo, San Jose, CA (US); Martin Jay Kinkade, Austin, TX (US); Bo Zheng, San Jose, CA (US); Brian Reed, San Jose, CA (US); Shrisagar Dwivedi, San Jose, CA (US)

(73) Assignee: ARM Limited, Cambridge (GB)

( * ) Notice: Subject to any disclaimer, the term of this patent is extended or adjusted under 35 U.S.C. 154(b) by 0 days.

(21) Appl. No.: 14/063,612

(22) Filed: Oct. 25, 2013

(65) Prior Publication Data

US 2015/0117119 A1    Apr. 30, 2015

(51) Int. Cl.
  *G11C 7/10* (2006.01)
  *G11C 7/12* (2006.01)

(52) U.S. Cl.
  CPC ........................................ *G11C 7/12* (2013.01)

(58) Field of Classification Search
  CPC ...... G11C 11/419; G11C 11/412; G11C 7/12; G11C 11/417; G11C 8/08; G11C 11/418
  USPC .......... 365/189.02, 189.11, 226, 189.14, 203, 365/156, 189.16, 227
  See application file for complete search history.

(56) References Cited

U.S. PATENT DOCUMENTS

2007/0081379 A1*  4/2007  Clinton et al. ................ 365/149
2013/0268737 A1* 10/2013  Bajkowski et al. ..... 365/189.011

* cited by examiner

*Primary Examiner* — Thong Q Le
(74) *Attorney, Agent, or Firm* — Pramudji Law Group PLLC; Ari Pramudji

(57) ABSTRACT

Memory circuitry is provided with write assist circuitry for generating a lower power supply voltage during write operations. The write assist circuitry includes a plurality of series connected switches including a header switch and a footer switch. Header bias circuitry generates a header bias voltage and footer bias circuitry generates a footer bias voltage. The header bias voltage is an analog signal with a voltage level intermediate between the power supply voltage level and the ground voltage level. The footer bias voltage is an analog signal with a voltage level intermediate between the power supply voltage level and the ground voltage level. During write operation target bit cells to be written are supplied with the power via a current path through the header switch while these are respectively controlled by the header bias voltage and the footer bias voltage.

17 Claims, 16 Drawing Sheets

MEMORY CIRCUITRY WITH WRITE ASSIST

BACKGROUND OF THE INVENTION

1. Field of the Invention

This invention relates to the field of memory circuitry. More particularly, this invention relates to memory circuitry including write assist mechanisms that seek to make it easier to overcome the feedback within a bit cell when seeking to change a bit value stored within a bit cell.

2. Description of the Prior Art

It is known to provide memory circuitry with write assist mechanisms which serve to lower the power supply voltage to bit cells which are to be written. Lowering the power supply voltage has the result of making it easier to overcome the feedback within a bit cell which seeks to maintain a current bit cell value. There are various problems with known write assist circuitry. The write assist circuitry should provide accurate control of the power supply voltage to the bit cells to be written such that the changing of a bit value is made easier, but there is not an undue risk of bit values being lost as the power supply voltage falls below a level needed by the bit cells to retain their bit values. This accurate control of the power supply voltage during write needs to occur across a wide range of manufacturing variation and operational conditions to which the memory circuitry may be subject. Furthermore, the dynamic current consumption associated with the write assist circuitry should be low in order to keep the current consumption of the memory circuitry as a whole at a desirably low level. It is also desirable that the write assist circuitry should have a low static current consumption when it is not in use and write operations are not taking place. Furthermore, the write assist circuitry should be able to accurately maintain a power supply voltage to the bit cells to be written when operating with bit cell arrays of varying different sizes as may be produced in a compiled memory. A memory may be compiled to have significantly different array sizes depending upon the target requirements and it is desirable that the write assist circuitry should be able to operate satisfactorily with arrays of bit cells of varying sizes without requiring significant modification to the write assist circuitry.

SUMMARY OF THE INVENTION

Viewed from one aspect the present invention provides memory circuitry comprising:

a plurality of bit cells configured to store respective data bits;

write circuitry configured to write data bits to target bit cells of said plurality of bit cells during a write operation; and write assist circuitry configured to lower a power supply signal supplied to said target bit cells during said write operation; wherein said write assist circuitry comprises:

a plurality of switches connected in series between a first power supply rail having a first power supply signal level and a second power supply rail having a second power supply signal level, said plurality of switches including a header switch having a header gate input and a footer switch having a footer gate input;

header bias circuitry configured to generate a header bias signal supplied to said header gate input during said write operation; and footer bias circuitry configured to generate a footer bias signal supplied to said footer gate input during said write operation;

said header bias signal is an analog signal with a signal level intermediate between said first power supply signal level and said second power supply signal level;

said footer bias signal is an analog signal with a signal level intermediate between said first power supply signal level and said second power supply signal level; and during said write operation said target bit cells are supplied with power via a current path through said header switch such that said power supply signal supplied to said target bit cells during said write operation is controlled by both said header bias signal and said footer bias signal.

The use by the present technique of both a header switch (e.g. a transistor) and a footer switch (e.g. transistor) controlled with analog bias signals has the advantage that the header switch can prevent the power supply signal supplied to the target bit cells being pulled too low while the footer switch can help ensure that the signal is pulled low enough to be effective in assisting the write operations to be performed. The signal levels controlled and used for controlling will typically be voltage levels.

The static power consumption of the write assist circuitry may be reduced in embodiments in which an enable switch controlled by an enable signal serves to block current flow through the plurality of switches, which include the header switch and the footer switch, when the write assist circuitry is inactive.

The write assist circuitry may be shared between multiple groups (columns) of bit cells by the provision of multiplexing circuitry which serves to selectively connect target bit cells to receive power via the header switch during write operations. Such multiplexing circuitry may also be configured to connect bit cells through a low impedance path to the first power supply rail when those bit cells are storing data bits and not subject to a write operation, i.e. connect those bit cells to the full power supply signal (voltage) when write assist operation is not desired.

While the header bias circuitry operates to generate an analog signal with a voltage level intermediate between the power supply voltage (first power supply signal level) and the ground voltage level (second power supply signal level) in a manner that enables a more accurate and consistent control of the power supply voltage during write assist operations, the header bias circuitry itself may be controlled with a header-digital-control signal which serves to select one of a plurality of analog voltage levels (voltage levels not at or substantially at the normal rail voltage levels) during write assist operation.

In some embodiments the header bias voltage may be taken from a header (voltage) node within the header bias circuitry and the header digital control signal used to control an impedance of at least one current path to the header (voltage) node. Controlling the impedance to the header (voltage) node allows the header bias (voltage) at that header voltage node to be adjusted to a level intermediate between the normal rail voltage levels (e.g. Vdd and ground).

In some embodiments the header-digital-control signal is a multi-bit signal and each bit of this may control an impedance of a respective current path to the header voltage node in order to provide the possibility for a variety of different levels of header bias voltage.

In some embodiments, in order to speed up write operations, the header bias circuitry may be configured to respond to a settling pulse corresponding to an initial period of the write operation to switch to a lower impedance state a settling current path to the header (voltage) node so as to drive the header (voltage) node towards the header bias voltage more rapidly. Once this initial period is over, then the settling current path may be returned to its high impedance state and remaining current paths selectively opened and closed by the header-digital-control signal to control the final level at which the header bias voltage settles.

The above features concerning the control of the header bias circuitry may also be employed with the same or similar advantages in respect of the footer bias circuitry in some embodiments.

As mentioned above, the header bias circuitry and/or the footer bias circuitry may be configured to provide a plurality of current paths between the power supply rail and the ground rail which are used to derive appropriate levels of bias voltage. In some embodiments the static current consumption of the bias circuitry may be reduced when these various current paths are all switched to a high impedance state when the write assist circuitry is inactive (i.e. not during the write operation).

While it will be appreciated that various different types of switches, such as transistors and gates, may be used to implement the present techniques (e.g. FINFET, nanotubes, etc), one form of implementation that is well suited to standard implementations is when the header switch is a PMOS switch and the footer switch is a PMOS switch.

Viewed from another aspect the present invention provides a memory circuitry comprising:
  a plurality of bit cell means for storing respective data bits;
  write means for writing data bits to target bit cell means of said plurality of bit cell means during a write operation; and
  write assist means for lowering a power supply signal supplied to said target bit cell means during said write operation; wherein
    said write assist means comprises:
    a plurality of switches connected in series between a first power supply rail having a first power supply signal level and a second power supply rail having a second power supply signal level, said plurality of switches including a header switch having a header gate input and a footer switch having a footer gate input;
    header bias means for generating a header bias signal supplied to said header gate input during said write operation; and
    footer bias means for generating a footer bias signal supplied to said footer gate input during said write operation;
  said header bias signal is an analog signal with a signal level intermediate between said first power supply signal level and said second power supply signal level;
  said footer bias signal is an analog signal with a signal level intermediate between said first power supply signal level and said second power supply signal level; and
  during said write operation said target bit cell means are supplied with power via a current path through said header switch such that said power supply signal supplied to said target bit cell means during said write operation is controlled by both said header bias signal and said footer bias signal.

Viewed from a further aspect the present invention provides a method of operating memory circuitry comprising the steps of:
  storing within a plurality of bit cells respective data bits;
  writing data bits to target bit cells of said plurality of bit cells during a write operation; and
  using write assist circuitry to lower a power supply signal supplied to said target bit cells during said write operation; wherein
    said write assist circuitry comprises:
    a plurality of switches connected in series between a first power supply rail having a first power supply signal level and a second power supply rail having a second power supply signal level, said plurality of switches including a header switch having a header gate input and a footer switch having a footer gate input;
    header bias circuitry for generating a header bias signal supplied to said header gate input during said write operation; and
    footer bias circuitry for generating a footer bias signal supplied to said footer gate input during said write operation;
  said header bias signal is an analog signal with a signal level intermediate between said first power signal level and said second power supply signal level;
  said footer bias signal is an analog signal with a signal level intermediate between said first power supply signal level and said second power supply signal level; and
  during said write operation said target bit cells are supplied with power via a current path through said header switch such that said power supply signal supplied to said target bit cells during said write operation is controlled by both said header bias signal and said footer bias signal.

Viewed from a further aspect the present invention provides a memory circuitry comprising:
  a plurality of bit cells configured to store respective data bits; write circuitry configured to write data bits to target bit cells of said plurality of bit cells during a write operation; and
  write assist circuitry configured to lower a power supply signal supplied to said target bit cells during said write operation; wherein
    said write assist circuitry is configured to respond to one or more multi-bit control signals to lower said power supply signal by an amount controlled by said one or more multi-bit control signals.

The above technique permits a variety of different degrees of lowering of the power supply voltage during write operations to be achieved and thereby to match the action of the write assist circuitry to particular manufacturing or operational condition variations arising in individual instances of the memory circuitry.

Viewed from another aspect the present invention provides a memory circuitry comprising:
  a plurality of bit cell means for storing respective data bits;
  write means for writing data bits to target bit cell means of said plurality of bit cell means during a write operation; and
  write assist means lowering a power supply signal supplied to said target bit cells during said write operation; wherein
  said write assist means responds to one or more multi-bit control signals to lower said power supply signal by an amount controlled by said one or more multi-bit control signals.

Viewed from a further aspect the present invention provides a method of operating memory circuitry comprising:
  storing within a plurality of bit cells respective data bits;
  writing data bits to target bit cells of said plurality of bit cells during a write operation;
  lowering a power supply signal supplied to said target bit cells during said write operation; and
  responding to one or more multi-bit control signals to lower said power supply signal by an amount controlled by said one or more multi-bit control signals.

The above, and other objects, features and advantages of this invention will be apparent from the following detailed description of illustrative embodiments which is to be read in connection with the accompanying drawings.

DESCRIPTION OF THE EMBODIMENTS

Figure 1:
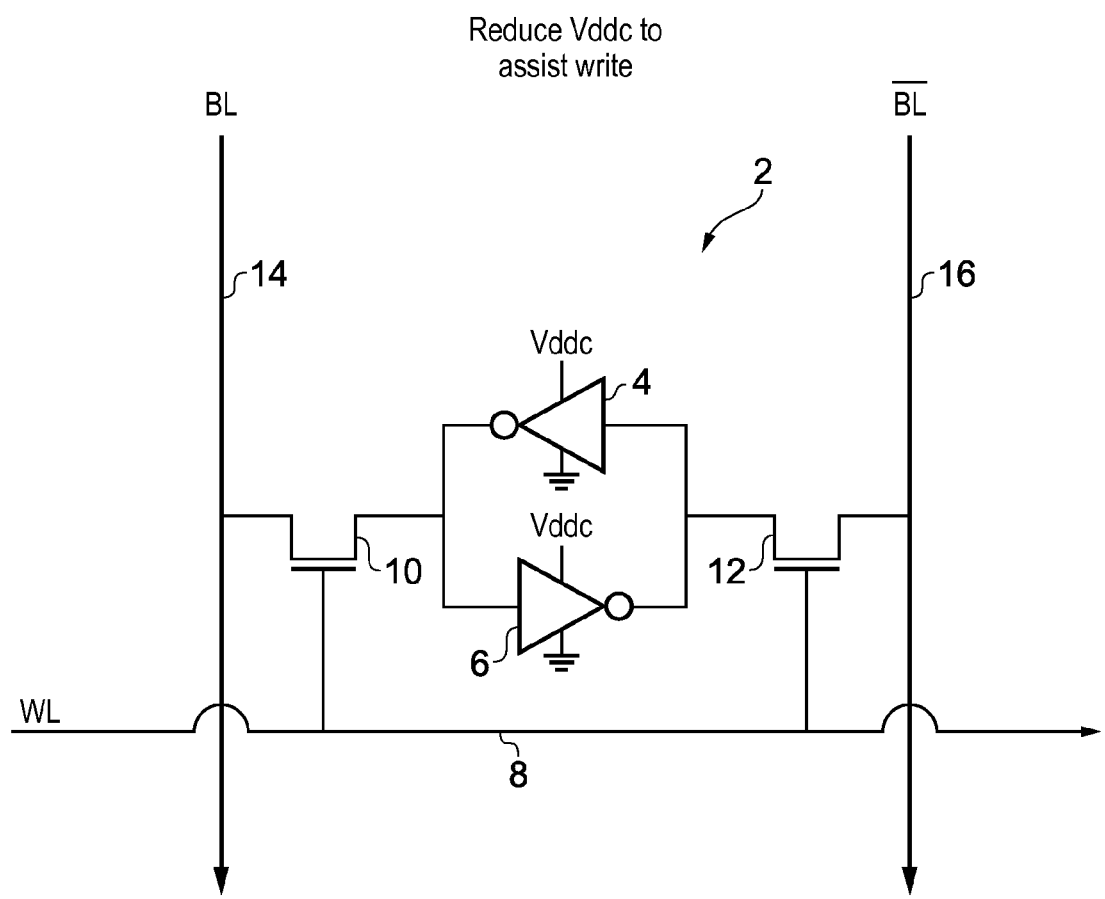
FIG. 1 schematically illustrates a bit cell for use within memory circuitry.

FIG. 1 schematically illustrates a bit cell 2 comprising two inverters 4, 6 arranged to provide mutual feedback and thereby store a bit value. A signal on word line 8 serves to open transistors 10, 12 and so couple the inverters 4, 6 to bit lines 14, 16. If it is desired to write a bit value into the bit cell 2, then an appropriate one of the bit lines 14, 16 will be driven low and, if necessary, this will overcome any existing different state held within the bit cell 2 and force it to adopt a state corresponding to the bit line 14, 16 which has been driven low.

This write operation may be assisted by reducing the supply voltage Vddc of the inverters 4, 6 during the write operation so as to weaken the strength of the mutual feedback they provide and so make it easier for the signal level imposed upon one of the bit lines 14, 16 to change the data value stored if this is necessary. Such lowering of the supply voltage may be applied on a column-by-column basis within an array of bit cells. The individual row of bit cells to be written will then be selected by the appropriate word line signal. If the power supply voltage for a column is reduced to a value which is too low, then this can result in bit cells which are not being written inappropriately failing to retain their bit values due to an undue weakening in the feedback within those bit cells. Conversely, if the power supply voltage is not lowered sufficiently, then a desired write operation which should change a stored bit value may not take place as the signal value on the bit line may not sufficiently overcome the feedback within the bit cell. Furthermore, as process geometries become smaller in size, there is an increasing exposure to manufacturing and operating condition variation within large arrays of bit cells. The write assist circuitry itself may also be subject to such manufacturing and operating condition variation and accordingly it is desirable that the form of the write assist circuitry is such that it is able to produce an appropriate reduction in the power supply voltage even in the presence of a wide range of manufacturing and operating condition variation.

Figure 2:
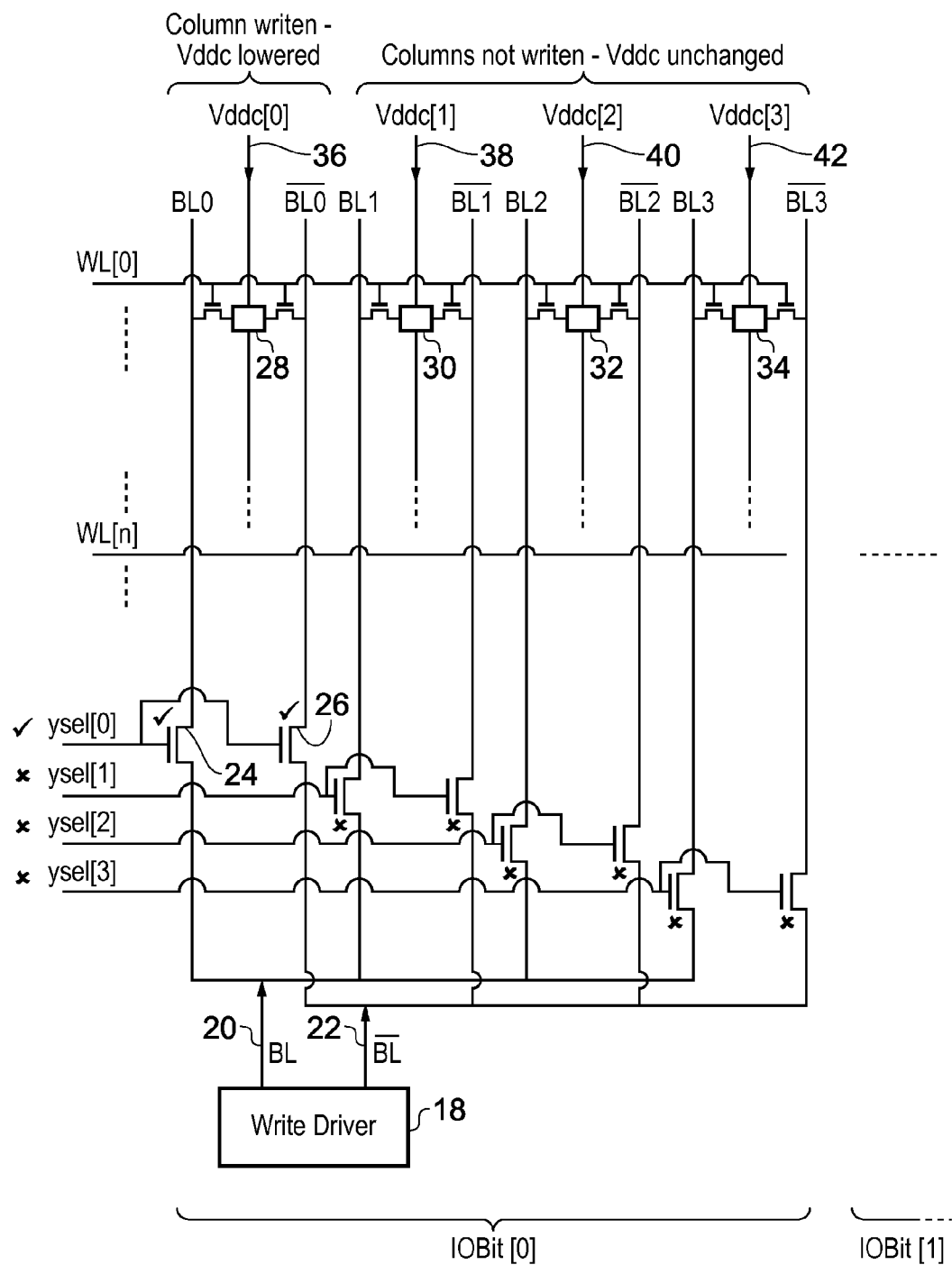
FIG. 2 schematically illustrates write circuitry for use with an array of bit cells.

FIG. 2 schematically illustrates write circuitry within memory circuitry. A write driver 18 serves to drive low one of the bit lines 20, 22 in a manner consistent with a data value it is desired to write into a selected bit cell. FIG. 2 illustrates four columns of bit cells and the desired column to write to is selected by a ysel(n) signal which controls transistors 24, 26 disposed between the write driver 18 and the bit cells 28, 30, 32, 34. In the example illustrated, the column select signal ysel(0) is driven high and so the column of bit cells containing bit cell 28 is selected. The individual bit cell 28 is selected by asserting the word line signal WL [0] for the row of bit cells containing bit cell 28.

As illustrated in FIG. 2, columns of bit cells share respective column power supply signal lines 36, 38, 40, 42 which carries a power supply signal Vddc[n] for each column. These individual column power supplies may have their voltage level lowered in order to provide write assistance. In the example illustrated, the power supply voltage Vddc[0] is lowered to provide write assistance to bit cell 28 whereas the column power supply voltages for the remaining columns are unchanged. FIG. 2 represents the columns and writing for an individual IO bit and it will be appreciated that a typical memory circuit will include a large number of such IO bits.

Figure 3:
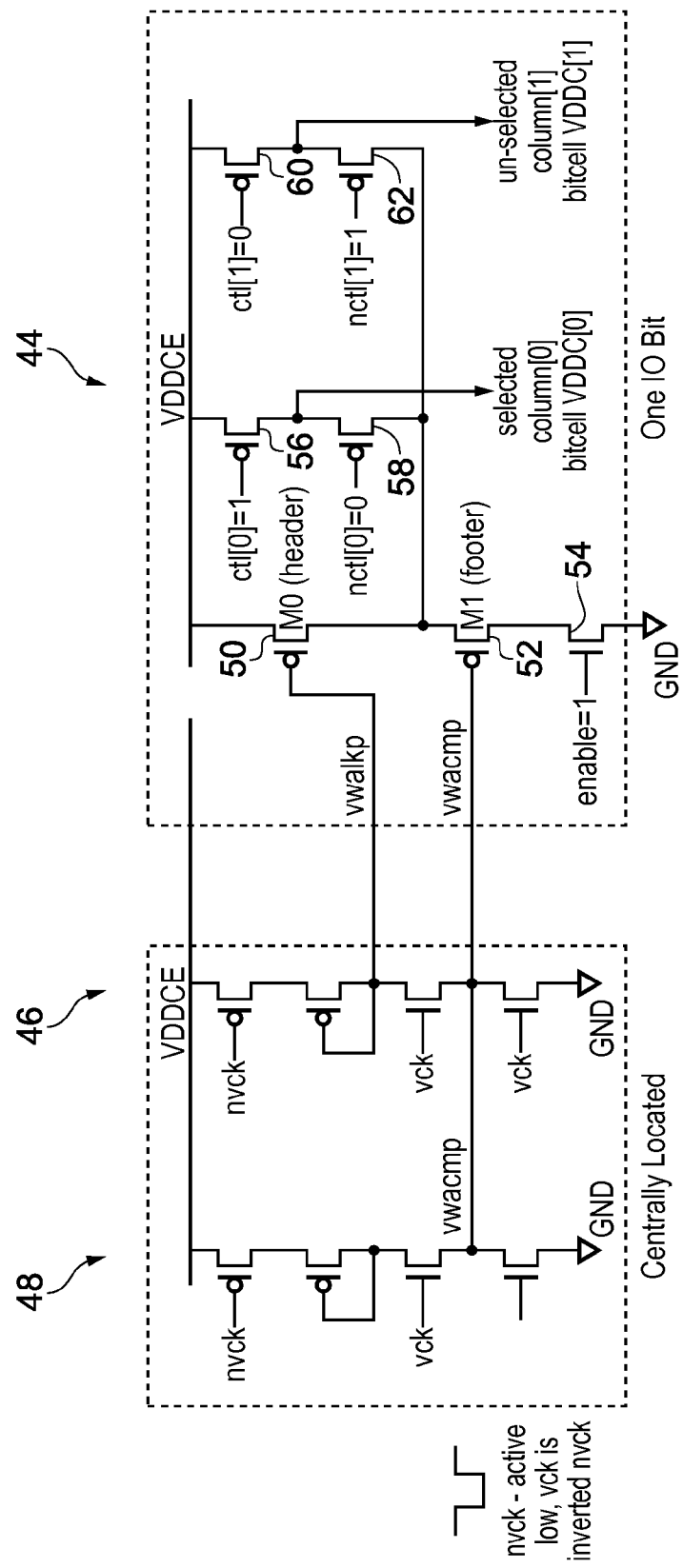
FIG. 3 schematically illustrates write assist circuitry for use in lowering the power supply voltage to bit cells during write operations.

FIG. 3 schematically illustrates write assist circuitry 44 including header bias circuitry 46 and footer bias circuitry 48. This example circuitry uses switches in the form of PMOS transistors, but other forms of switch may be used in addition to or instead of PMOS transistors. The header bias circuitry 46 generates a header bias signal vwalkp which is supplied to the gate of a PMOS transistor which is a header transistor 50. The footer bias circuitry 48 generates a footer bias voltage vwacmp which is supplied to the gate of a PMOS transistor which is a footer transistor 52. An enable transistor 54 is switched by an enable signal in order to block current flow through the header transistor 50 and the footer transistor 52 when write assist operation is not required. Other types of transistor may also be used, such as FINFET transistors or nanotube transistors.

The header bias circuitry 46 and the footer bias circuitry 48 are arranged such that the header bias voltage is an analog voltage signal with a value lying between the power supply voltage level Vddce and the ground voltage level GND. The footer bias circuitry 48 is arranged such that the footer bias voltage is an analog voltage with a level lying between the power supply voltage level Vddce and the ground voltage GND. The grounds shown in the drawing are connected to a ground rail as will be familiar to those in this technical field. The power supply voltage level Vddce is typically 1.0 Volts or less, often significantly less.

The action of the header bias circuitry 46 and the footer bias circuitry 48 is controlled by a write assist clock signal nvck which is active low and serves to switch on the current path through the stacks of transistors forming the header bias circuitry 46 and the footer bias circuitry 48 respectively. When write assist operation is not required, then the clock signal nvck serves to block all of the current paths through the header bias circuitry 46 and the footer bias circuitry 48 in order to reduce static power consumption.

The header bias voltage vwalkp and the footage bias voltage vwacmp are analog signals in the sense that they have values which significantly differ from either the power supply voltage level Vddce or the ground level voltage GND. In contrast, digital signals typically are at or very close to the rail voltage signal levels representing either a "zero" binary value or an "one" binary value. The header transistor 50 and the footer transistor 52 operate at below their respective saturation current levels when producing the lowered voltage for write assist.

The reduced power supply voltage which is taken from a node intermediate between the header transistor 50 and the footer transistor 52 is selectively applied to one of the columns of bit cells under action of multiplexing circuitry comprising, in this example, transistors 56, 58, 60, 62. The multiplexing circuitry responds to control signals ctl[n] to connect the column power supply lines, (such as the lines 36, 38, 40, 42 of FIG. 2) to either the full power supply rail voltage Vddce or the lowered supply voltage taken from the node between the header transistor 50 and the footer transistor 52.

Figure 4:
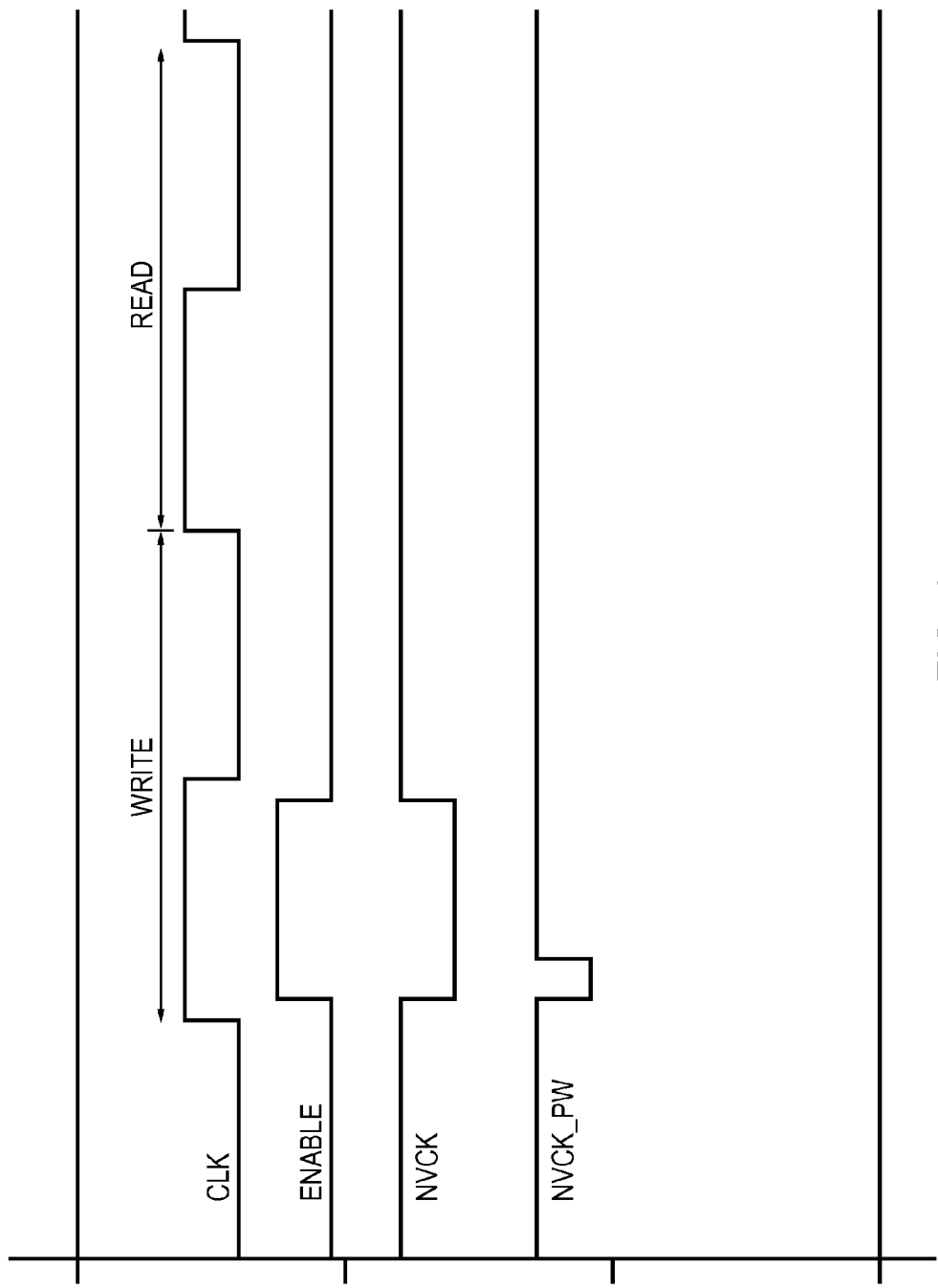
FIG. 4 schematically illustrates the relative timing of signals used to control the circuitry of FIG. 3.

FIG. 4 is a signal timing diagram schematically illustrating the relative timing of some of the control signals used to control the write assist operation of the circuitry of FIG. 3. Writing and reading is performed in synchronism with a clock signal CLK. Write assist operation during a write cycle is enabled by an enable signal ENABLE supplied to enable transistor 54. The header bias voltage vwalkp and the footer bias voltage vwacmp are produced under control of signal NVCK (and VCK). A settling pulse NVCK_PW is used to switch on circuitry to speed up the bias voltages reaching their final levels during an initial active portion of NVCK.

Figure 5:
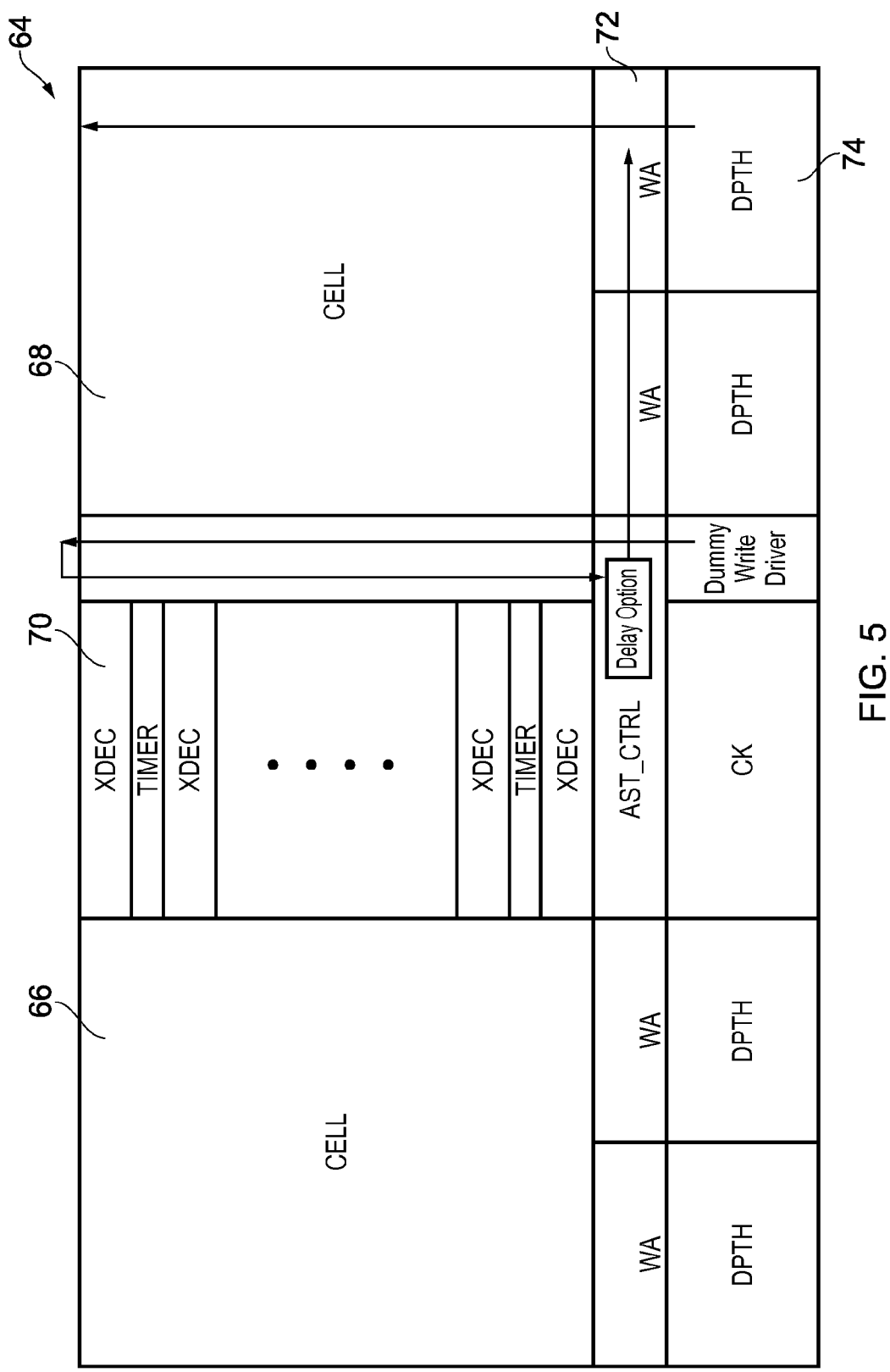
FIG. 5 schematically illustrates the layout of different blocks of circuitry within a memory.

FIG. 5 schematically illustrates the layout of memory circuitry 64 including arrays of bit cells 66, 68, which may be compiled memory, together with address decoder circuitry 70. Write assist circuitry 72 is provided in association with the columns of bit cells to serve to reduce the power supply voltage to columns of bit cells containing target bit cells to be written during the write operations. Data path circuitry 74 provides communication to and from the memory circuitry 64.

Figure 6:
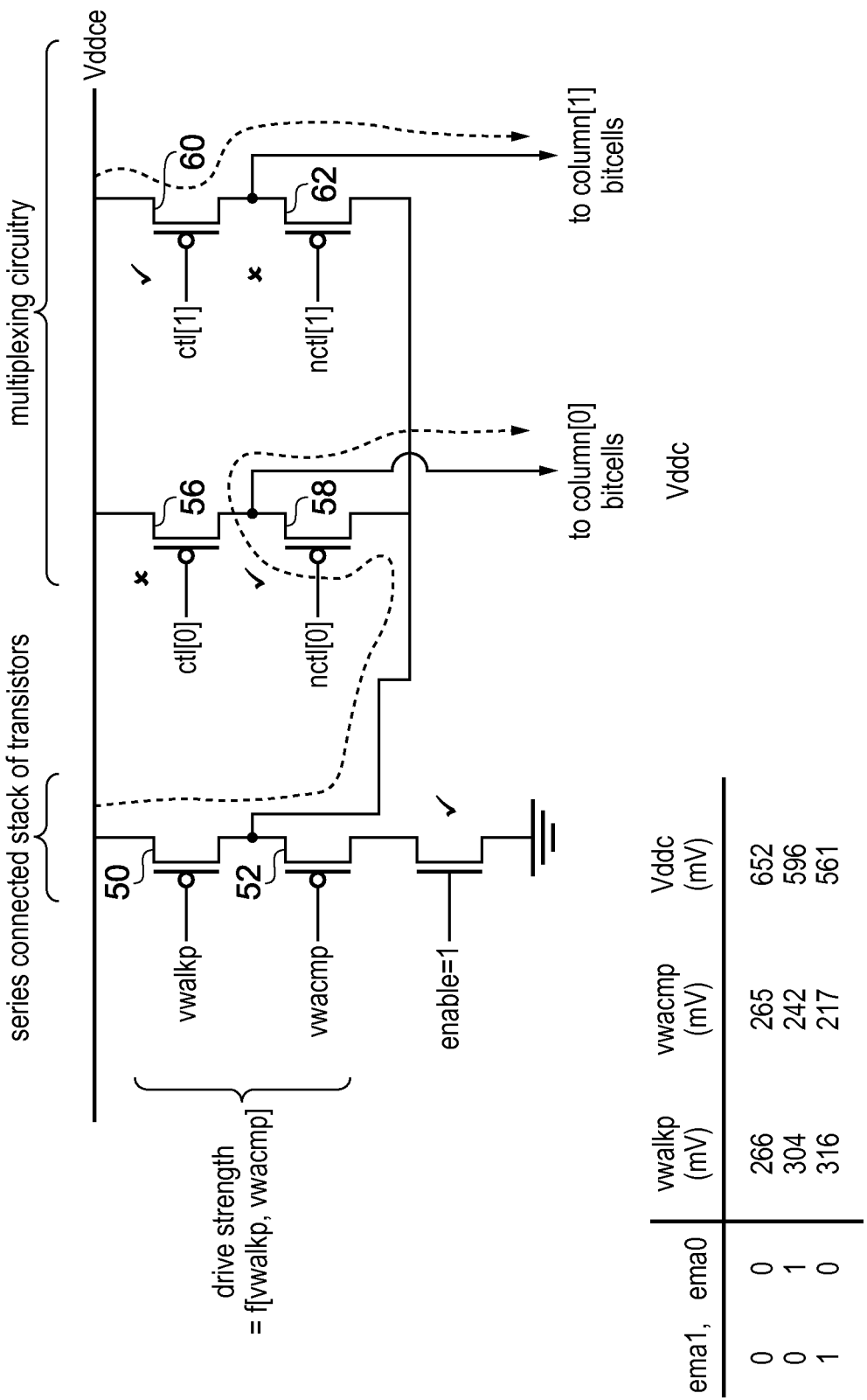
FIG. 6 schematically illustrates the operation of write assist circuitry in supplying both a lowered power supply voltage and a normal power supply voltage.

FIG. 6 schematically illustrates the write assist circuitry during operation. The drive strength of the header transistor 50 and the footer transistor 52 is controlled by the analog signals which form the header bias voltage vwalkp and the footer bias voltage vwacmp. The header bias voltage vwalkp and the footer bias voltage vwacmp are controlled by a multi-bit header-digital-control signal and a multi-bit footer-digital-control signal respectively. In this example embodiment, the header-digital-control signal and the footer-digital-control signal are the same and comprise two bits ema0 and ema1. In other embodiments these digital control signals could be independent. The table illustrated in FIG. 6 shows different values for the header bias voltage vwalkp and the footer bias voltage vwacmp for different values of these digital control signals and the corresponding values for the lowered supply voltage driven onto the selected power supply line of the column of bit cells which includes the target bit cell (the Vddce value in this example is 720 mV).

FIG. 6 illustrates the current path through the header transistor 50 and the transistor 58 to the selected column. The unselected column receives its power supply directly from the power supply rail via transistor 60. Different degrees of lowering of the power supply voltage achieved by the combined action of the header transistor 50 and the footer transistor 52 under control of their respective digital control signals are illustrated in the table of FIG. 5.

FIGS. 7 to 11 schematically illustrate header bias generation circuitry in different states of operation. This header bias generation circuitry is more complex than that illustrated in FIG. 3 and incorporates provision for the header-digital-control signals for controlling the header bias voltage generated. In particular, a header bias voltage node 76 serves as the source of the header bias voltage vwalkp and may be connected via different current paths to the power supply rail 78 and the ground rail 80.

Figure 7:
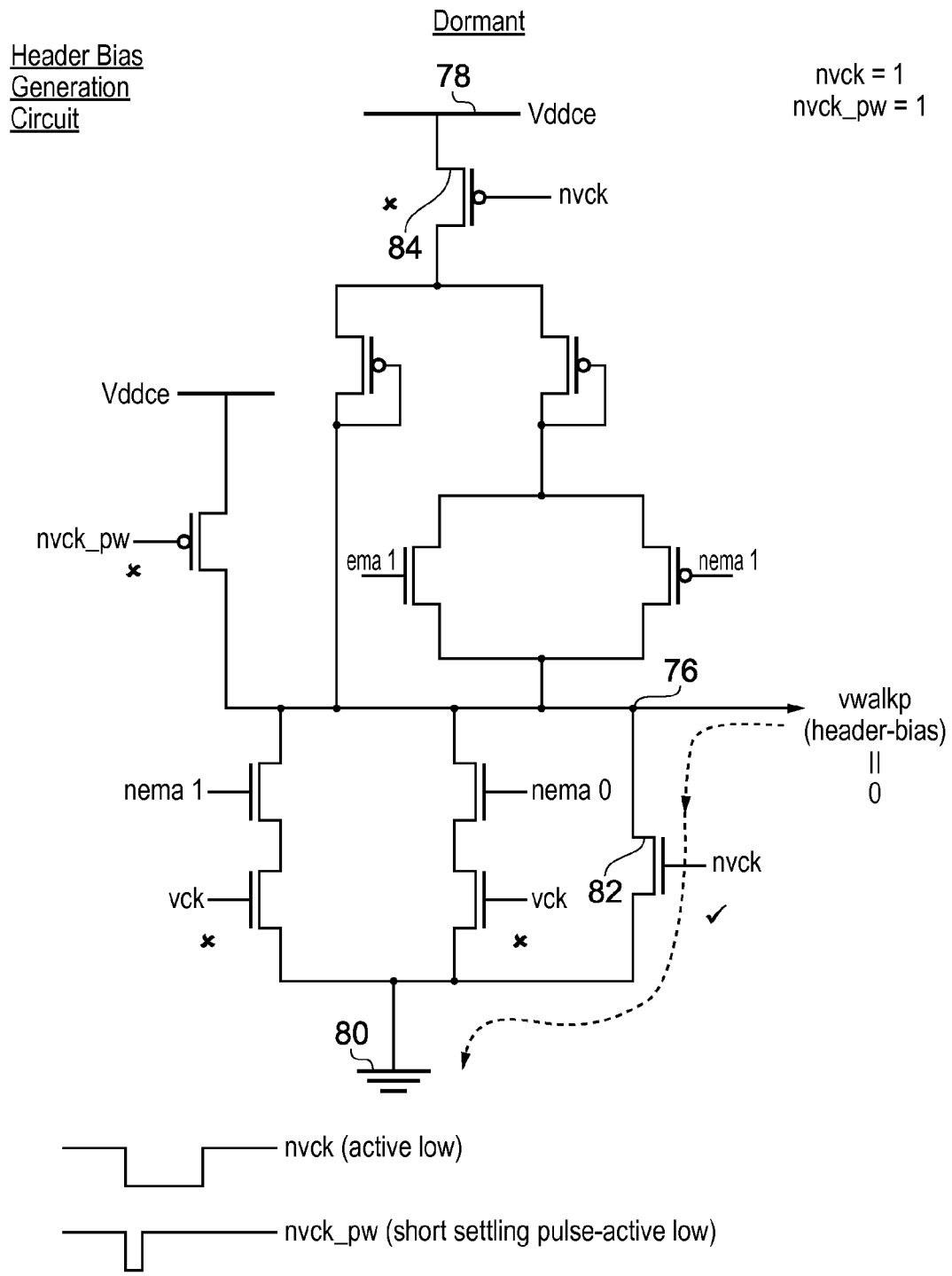
FIG. 7 schematically illustrates a header bias generation circuitry in its dormant state.

In the state illustrated in FIG. 7, the header bias generation circuitry is dormant and the clock signal nvck is high. The short settling pulse nvck_pw is also high. In this circumstance, the transistor 82 is open and the header voltage node is pulled low to the ground voltage GND. The transistor 84 is closed preventing any direct current path through the header bias generation circuitry.

Figure 8:
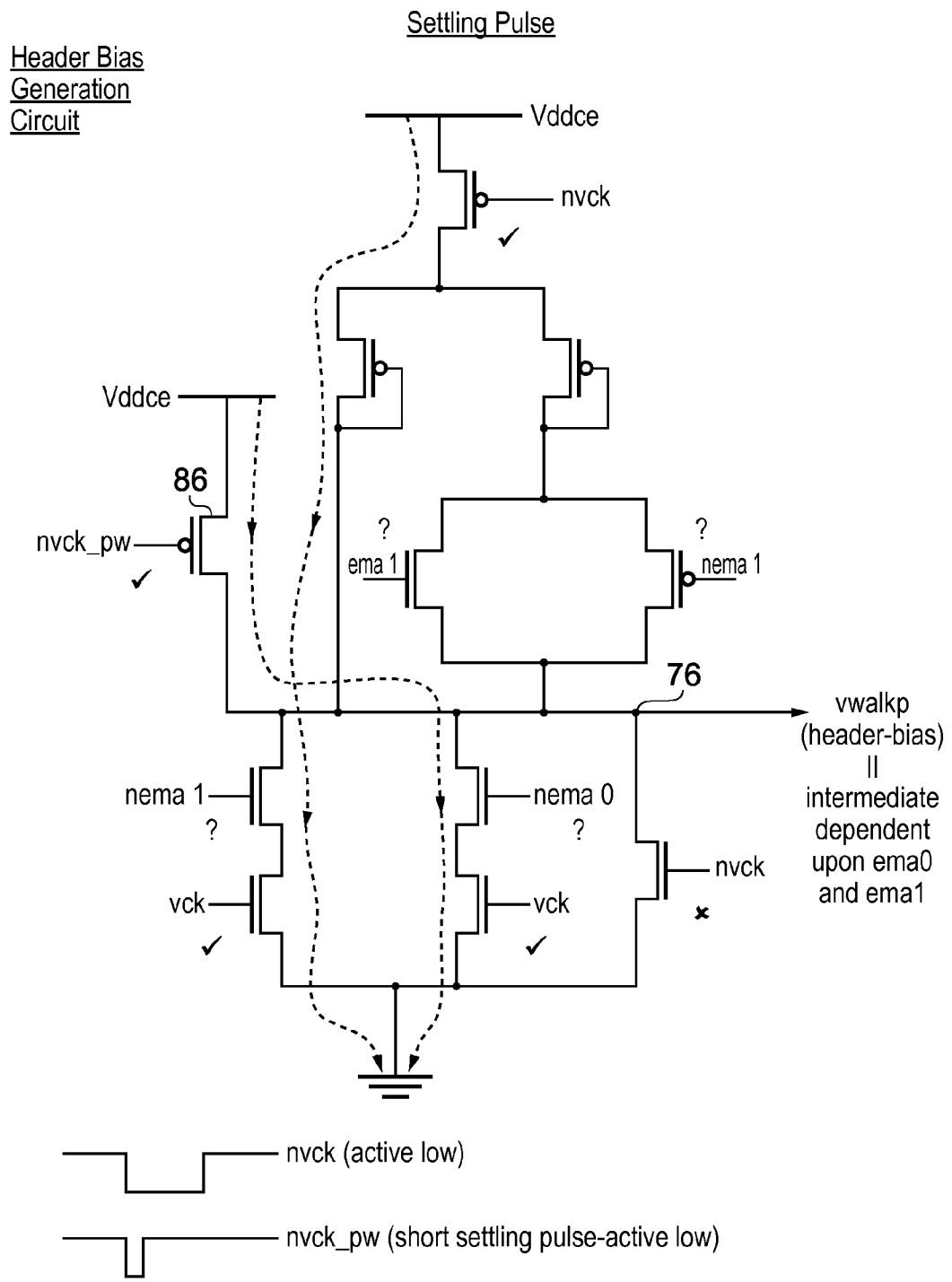
FIG. 8 schematically illustrates header bias generation circuitry during operation of a settling pulse.

In the state illustrated in FIG. 8, write operation is active with the clock nvclk low. The short settling pulse nvck_pw is also active during this initial period of the write operation. During this settling pulse period, transistor 86 is open and serves to drive the header voltage node 76 from its dormant voltage level at ground towards what will be its header bias voltage level during the write operation. The final value of the header bias voltage will be controlled by the header-digital-control signals ema0, ema1.

Figure 9:
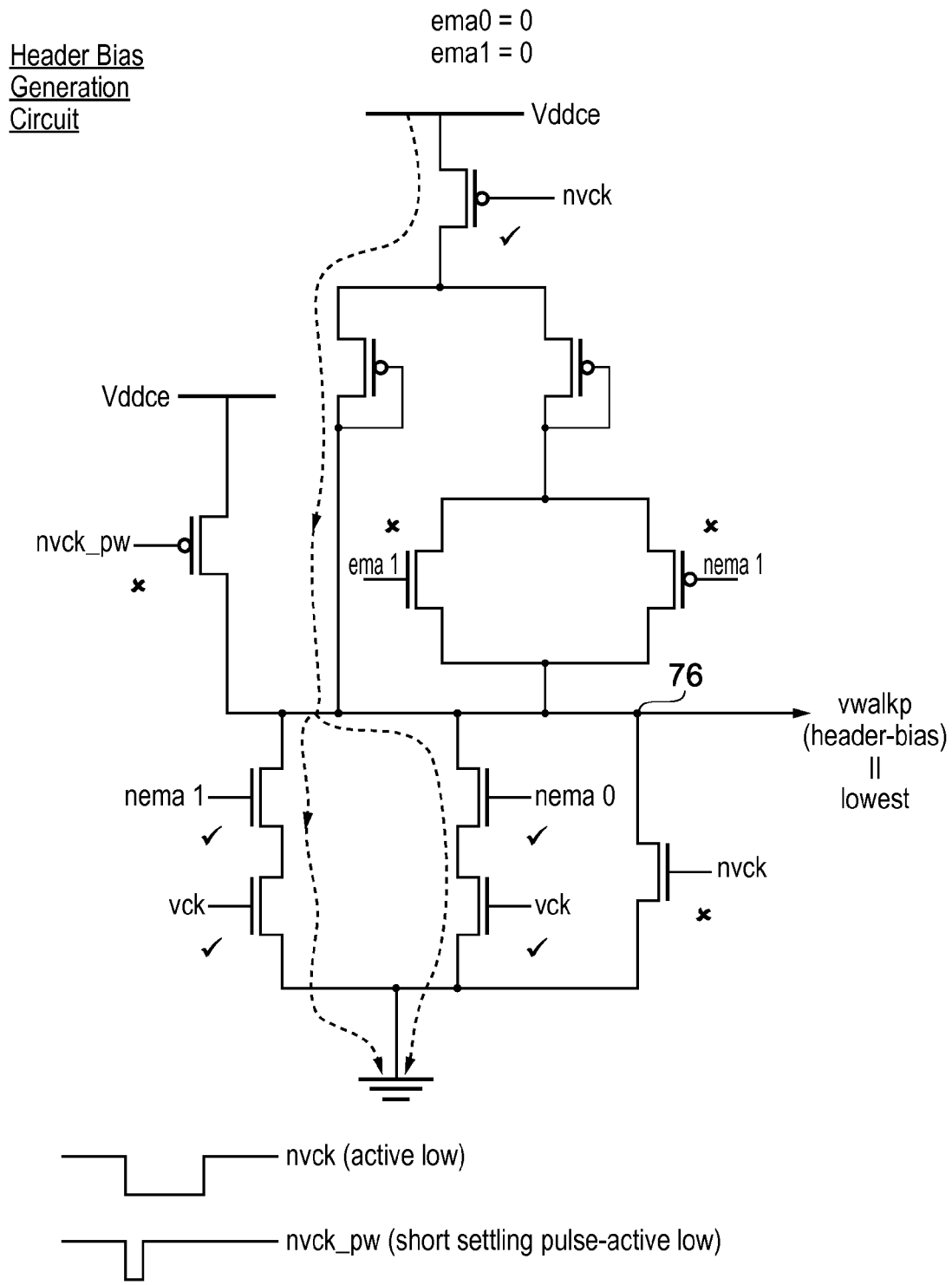
FIGS. 9, 10 and 11 schematically illustrate operation of a header bias generation circuitry with different header digital control values.

FIG. 9 schematically illustrates the header bias generation circuitry operating to generate its lowest value of the header bias voltage when the header-digital-control signals are both zero, i.e. ema0=0 and ema1=0. In this case, two current paths are open between the header voltage node 76 and ground.

Figure 10:
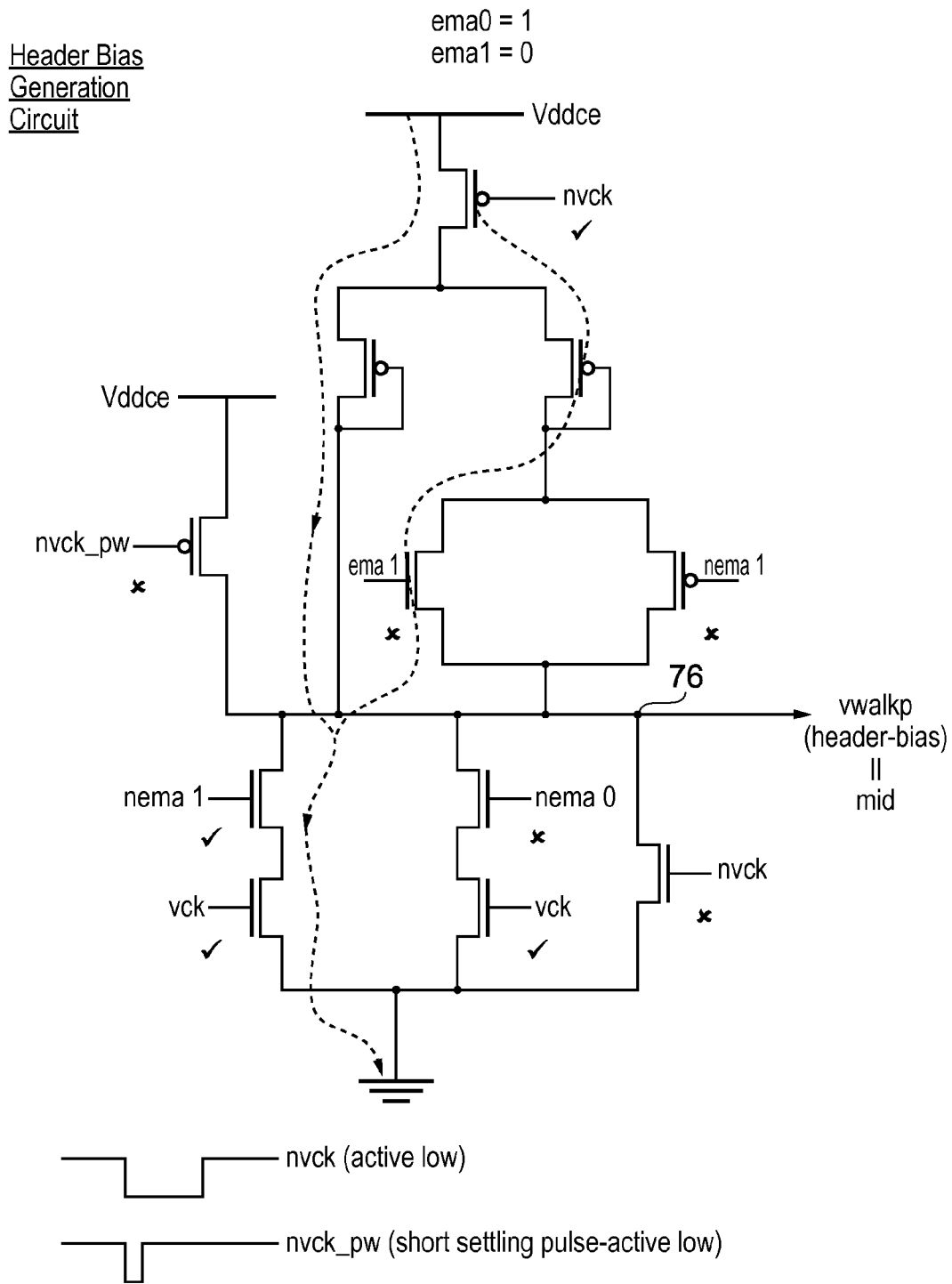

FIG. 10 schematically illustrates the operation of the header bias generation circuitry when the header digital control values are "01" and the header bias voltage is at its at a mid level. In this state only a single current path is open between the header voltage node 76 and ground.

Figure 11:
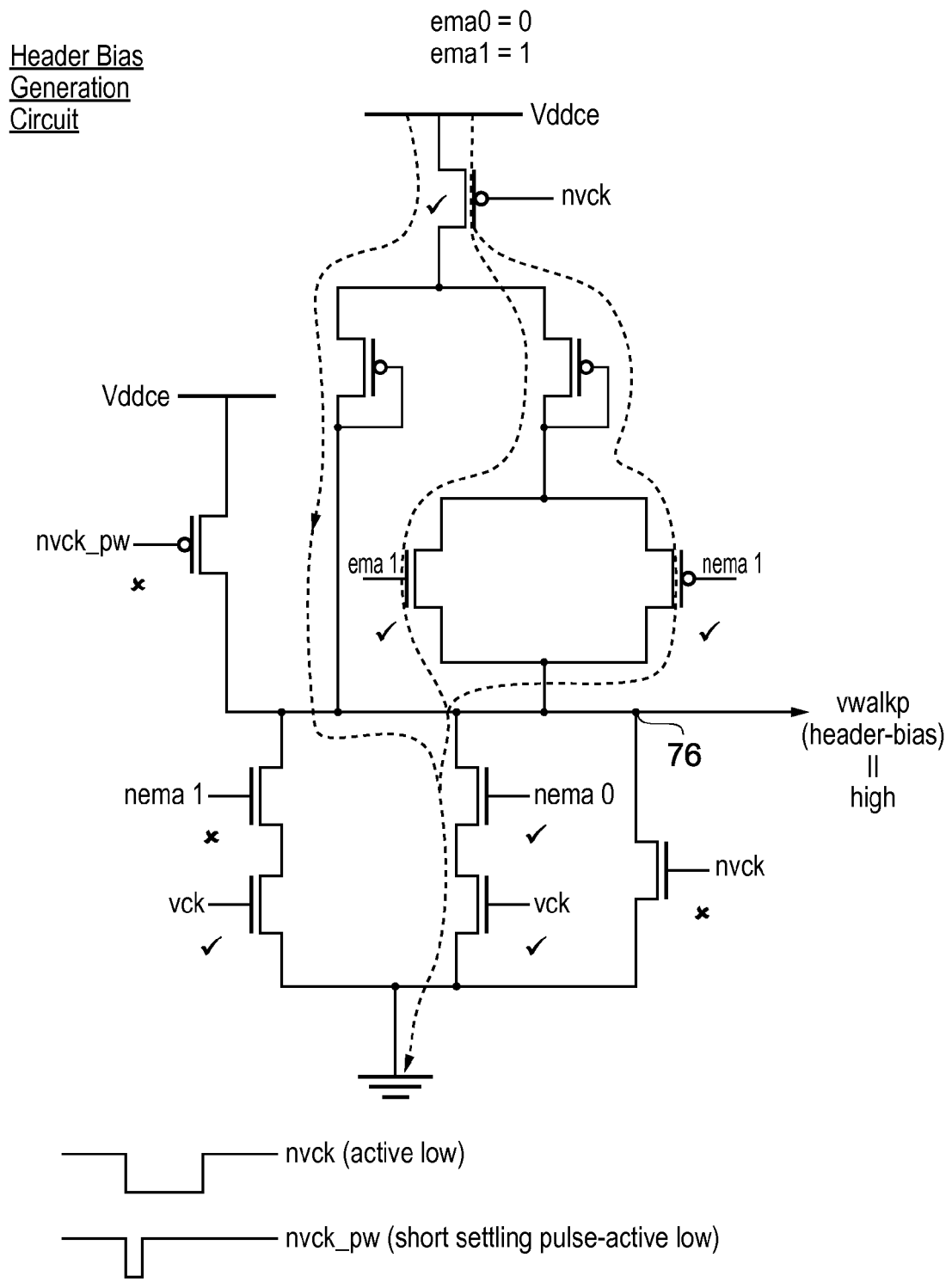

FIG. 11 schematically illustrates the operation of the header bias generation circuitry when the header digital control value is "10" and the header bias voltage is at a high level. In this state there is a single current path open between the header voltage node 76 and ground whereas additional current paths have been opened between the power supply rail at voltage Vddce and the header voltage node 76. This results in the header bias voltage settling at a high level.

It will be appreciated by those in this technical field that the absolute values of the header bias voltage resulting from the different values of the header-digital-control signal will vary in dependence upon the size and strength of the transistors providing current paths to and from the header voltage node 76. The size and strength of these transistors may be adjusted so as to result in a header bias voltage of the desired level in order to form an analog signal partway between the power supply voltage and ground which serves to control the header transistor 50.

Figure 12:
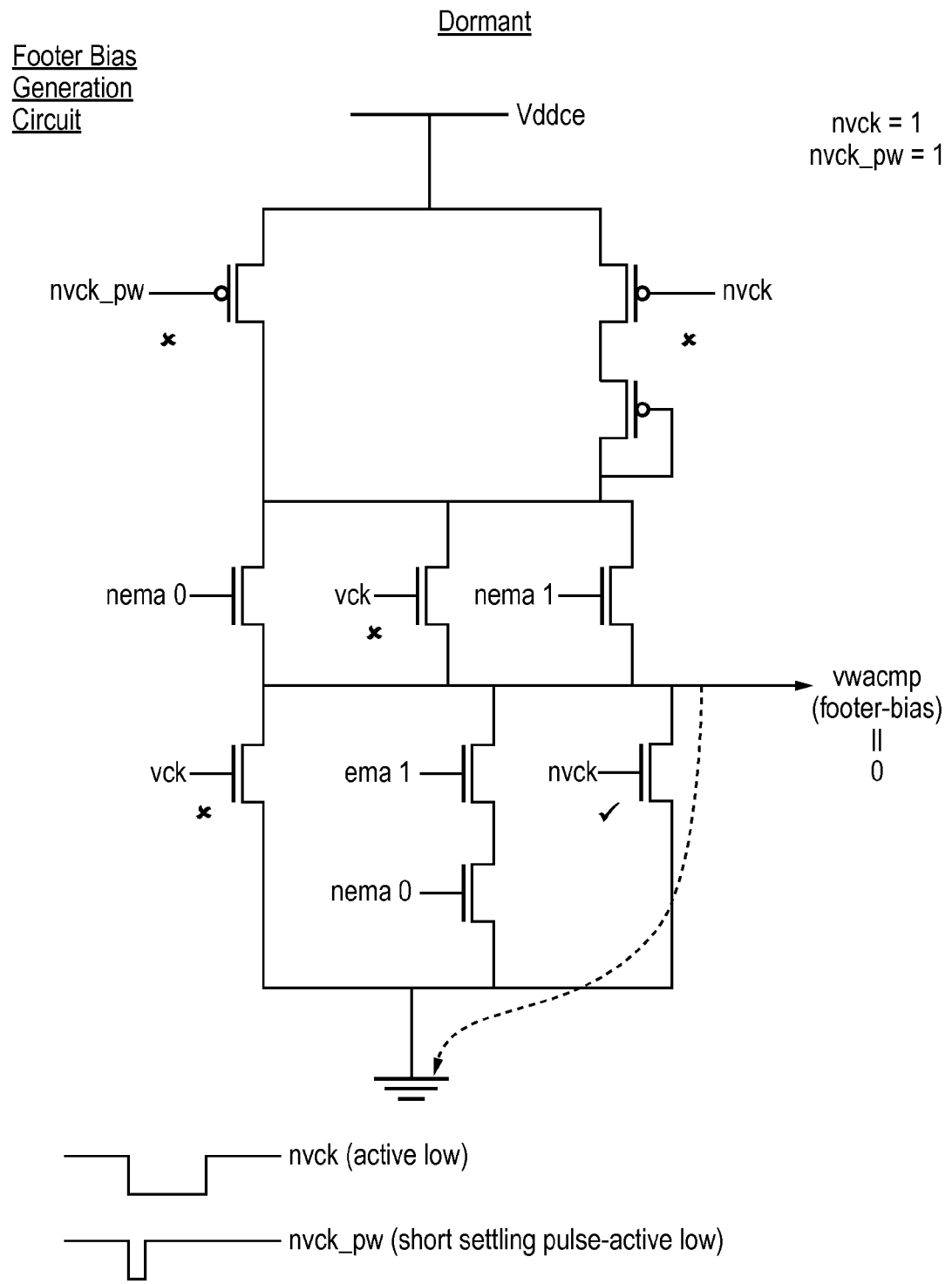
FIG. 12 schematically illustrates footer bias generation circuitry in its dormant state.
Figure 13:
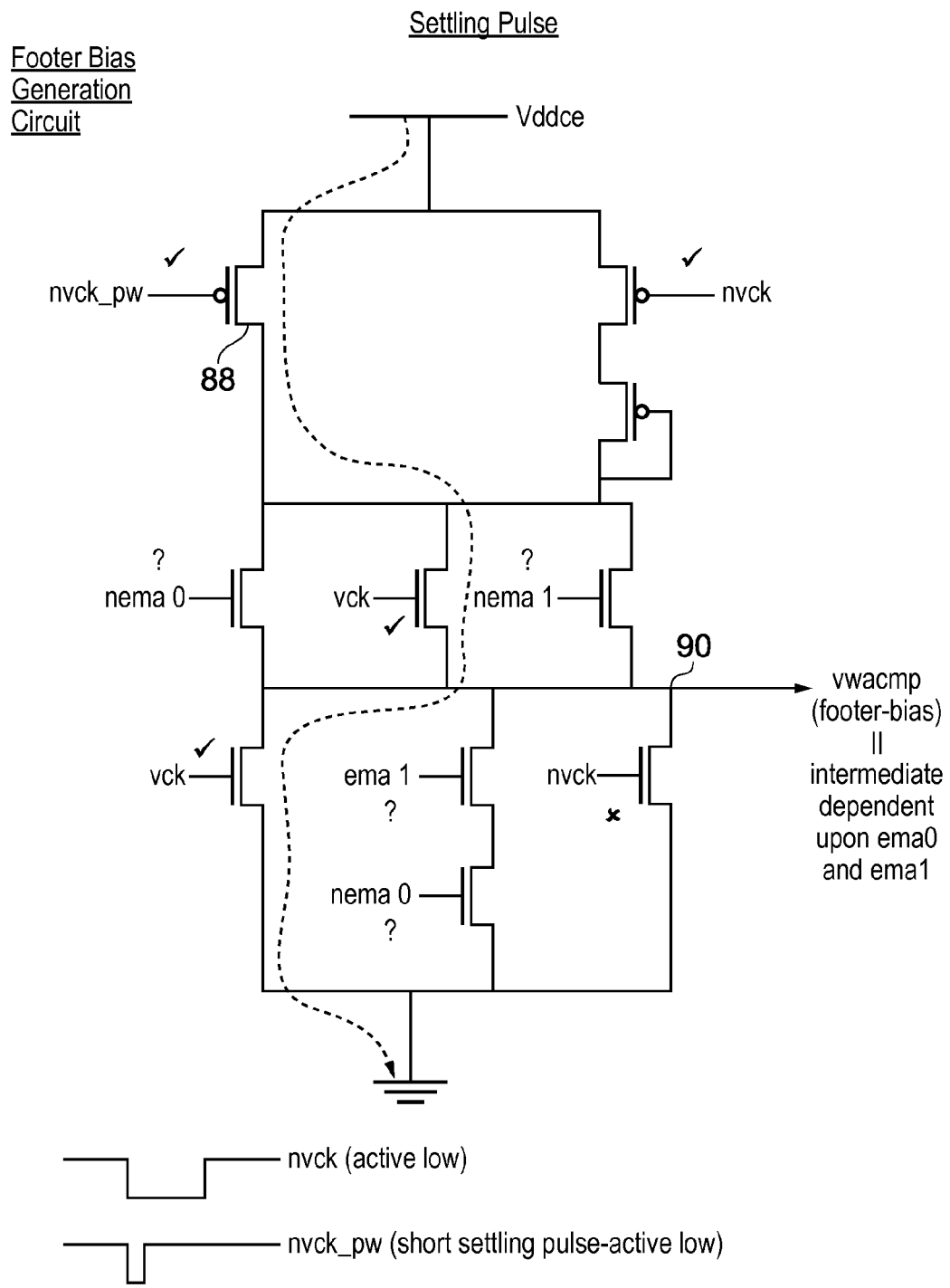
FIG. 13 schematically illustrates footer bias generation circuitry during operation of a settling pulse.
Figure 14:
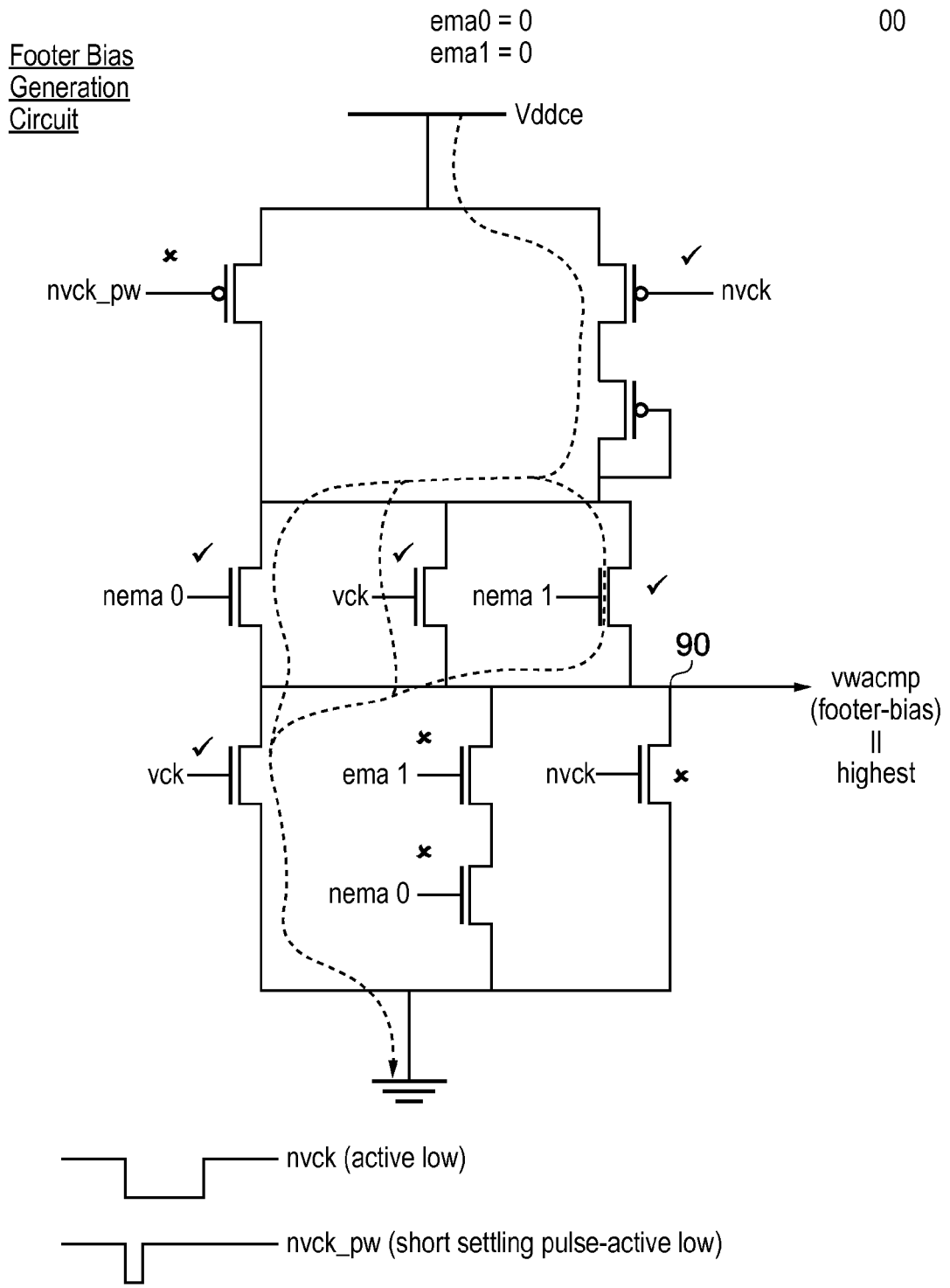
FIGS. 14, 15 and 16 schematically illustrate the operation of footer bias generation circuitry with different values of footer digital control values.
Figure 15:
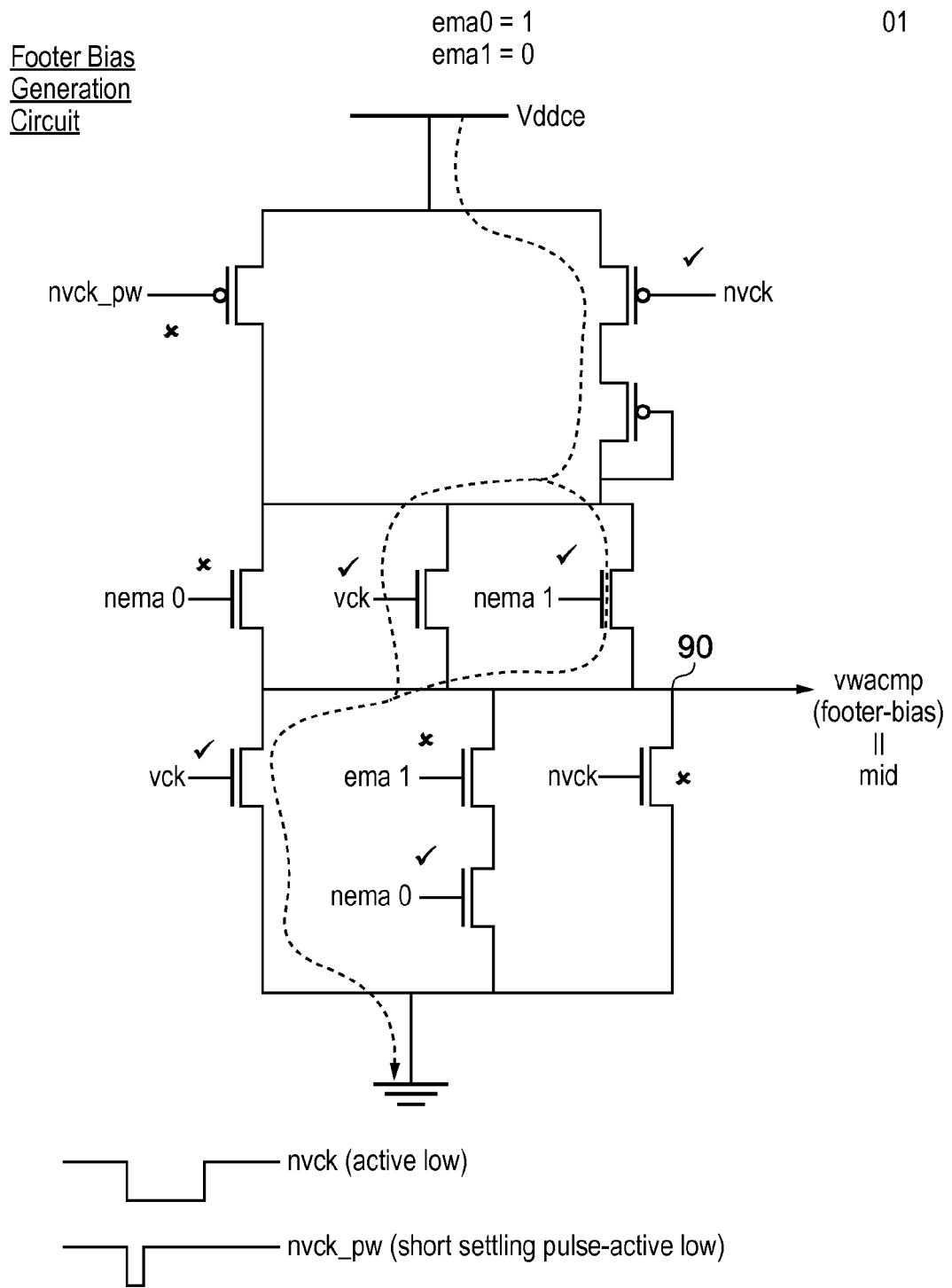
Figure 16:
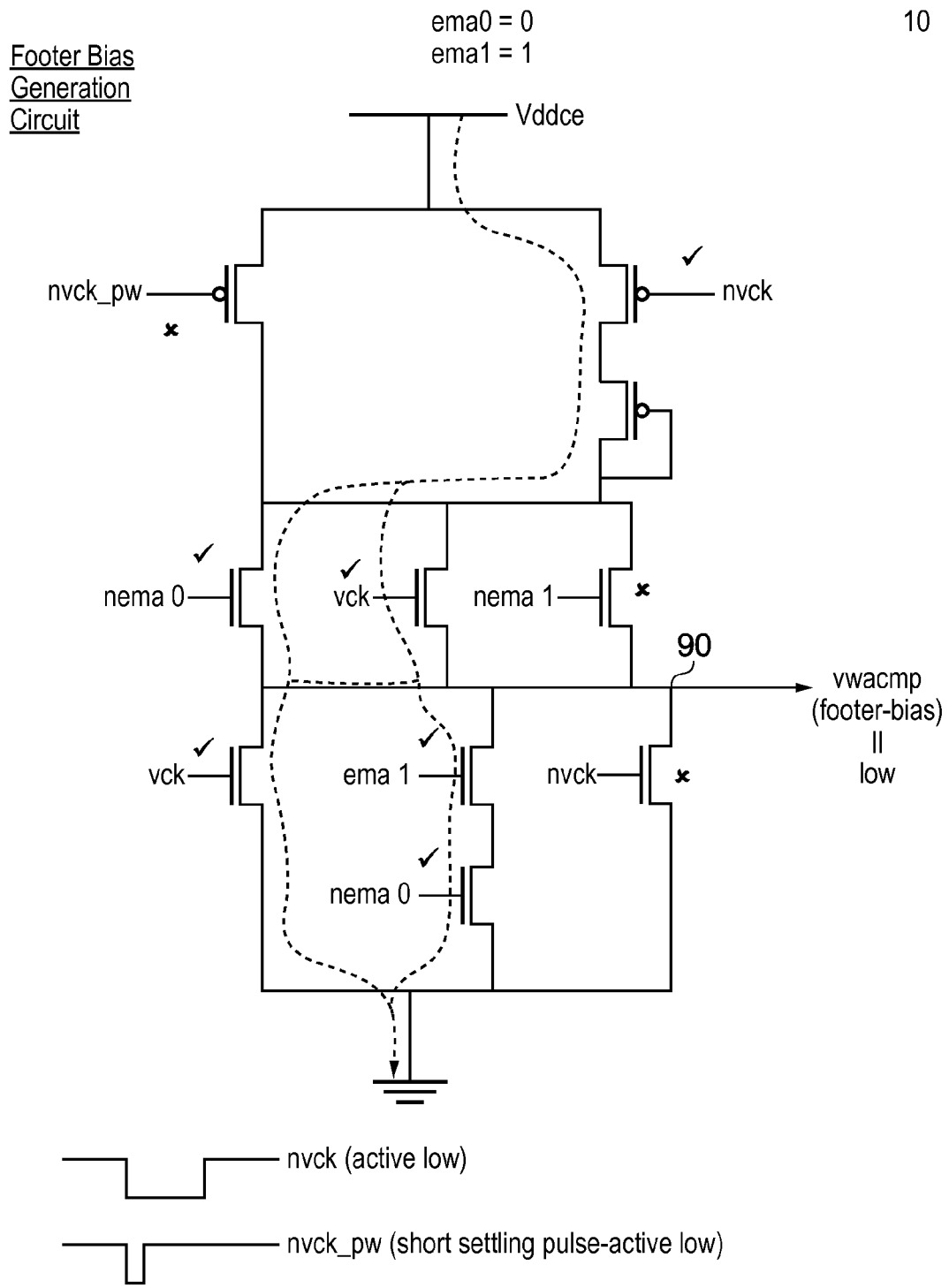

FIG. 12 schematically illustrates the footer bias generation circuitry in its dormant state. As for FIG. 7, the footer bias generation circuitry in its dormant state is controlled such that there is no direct current path between the power supply rail and ground. FIG. 13 schematically illustrates the operation of the footer bias generation circuitry during the action of the settling pulse. The action of the settling pulse opens an additional transistor 88 which serves to drive the footer voltage node 90 towards the footer bias voltage level and away from ground. This results in more rapid settling of the footer bias. FIGS. 14, 15 and 16 schematically illustrate the operation of the footer bias generation circuitry with different values for the footer-digital-control signals which respectively open and close different numbers of current paths to and from the footer voltage node 90. This results in different values for the footer bias voltage.

The relative forms of the header bias generation circuitry and the footer bias generation circuitry are such that the header bias voltage and the footer bias voltage will both have levels between the power supply voltage Vddce and the ground voltage level.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

We claim:

1. Memory circuitry comprising:
a plurality of bit cells configured to store respective data bits;
write circuitry configured to write data bits to target bit cells of said plurality of bit cells during a write operation; and
write assist circuitry configured to lower a power supply signal supplied to said target bit cells during said write operation; wherein
said write assist circuitry comprises:
a plurality of switches connected in series between a first power supply rail having a first power supply signal level and a second power supply rail having a second power supply signal level, said plurality of switches including a header switch having a header gate input and a footer switch having a footer gate input;
header bias circuitry configured to generate a header bias signal supplied to said header gate input during said write operation; and
footer bias circuitry configured to generate a footer bias signal supplied to said footer gate input during said write operation;
said header bias signal is an analog signal with a signal level intermediate between said first power supply signal level and said second power supply signal level;
said footer bias signal is an analog signal with a signal level intermediate between said first power supply signal level and said second power supply signal level; and
during said write operation said target bit cells are supplied with power via a current path through said header switch such that said power supply signal supplied to said target bit cells during said write operation is controlled by both said header bias signal and said footer bias signal.

2. Memory circuitry as claimed in claim 1, wherein said plurality of switches include an enable switch controlled by an enable signal to block current flow through said plurality of switches when said write assist circuitry is inactive.

3. Memory circuitry as claimed in claim 1, wherein said write assist circuitry includes multiplexing circuitry configured to selectively connect said target bit cells to receive power via said header switch and said footer switch during said write operation.

4. Memory circuitry as claimed in claim 3, wherein said multiplexing circuitry is configured to connect said target bit cells through a low impedance path to said first power supply rail when said target bit cells are storing data bits and not during said write operation.

5. Memory circuitry as claimed in claim 1, wherein said header bias circuitry is controlled by a header-digital-control signal to generate said header bias signal with a selected one of a plurality of analog signal levels.

6. Memory circuitry as claimed in claim as claimed in claim 5, wherein said header bias signal is taken from a header signal node within said header bias circuitry and said header-digital-control signal controls an impedance of at least one current path to said header signal node.

7. Memory circuitry as claimed in claim 6, wherein said header-digital-control signal is a multi-bit signal and each bit of said header digital control signal controls an impedance of a respective current path to said header signal node.

8. Memory circuitry as claimed in claim 6, wherein said header bias circuitry is configured to respond to a settling pulse corresponding to an initial period of said write operation to switch to a low impedance state a settling current path to said header signal node so as to drive said header signal node toward said header bias signal.

9. Memory circuitry as claimed in claim 1, wherein said footer bias circuitry is controlled by a footer-digital-control signal to generate said footer bias signal with a selected one of a plurality of analog signal levels.

10. Memory circuitry as claimed in claim 9, wherein said footer bias signal is taken from a footer signal node within said footer bias circuitry and said footer-digital-control signal controls an impedance of at least one current path to said footer signal node.

11. Memory circuitry as claimed in claim 10, wherein said footer-digital-control signal is a multi-bit signal and each bit of said footer digital control signal controls an impedance of a respective current path to said footer signal node.

12. Memory circuitry as claimed in claim 10, wherein said footer bias circuitry is configured to respond to a settling pulse corresponding to an initial period of said write operation to switch to a low impedance state a settling current path to said footer signal node so as to drive said footer signal node toward said footer bias signal.

13. Memory circuitry as claimed in claim 1, wherein said header bias circuitry provides a plurality of current paths between said first power supply rail and said second power supply rail and said header bias circuitry is configured to switch to a high impedance state when not during said write operation all of said plurality of current paths between said first power supply rail and said second power supply rail.

14. Memory circuitry as claimed in claim 1, wherein said footer bias circuitry provides a plurality of current paths between said first power supply rail and said second power supply rail and said footer bias circuitry is configured to switch to a high impedance state when not during said write operation all of said plurality of current paths between said first power supply rail and said second power supply rail.

15. Memory circuitry as claimed in claim 1, wherein said header switch is a PMOS switch and said footer switch is a PMOS switch.

16. Memory circuitry comprising:
a plurality of bit cell means for storing respective data bits;
write means for writing data bits to target bit cell means of said plurality of bit cell means during a write operation; and
write assist means for lowering a power supply signal supplied to said target bit cell means during said write operation; wherein
said write assist means comprises:
a plurality of switches connected in series between a first power supply rail having a first power supply signal level and a second power supply rail having a second power supply signal level, said plurality of switches including a header switch having a header gate input and a footer switch having a footer gate input;
header bias means for generating a header bias signal supplied to said header gate input during said write operation; and
footer bias means for generating a footer bias signal supplied to said footer gate input during said write operation;
said header bias signal is an analog signal with a signal level intermediate between said first power supply signal level and said second power supply signal level;

said footer bias signal is an analog signal with a signal level intermediate between said first power supply signal level and said second power supply signal level; and during said write operation said target bit cell means are supplied with power via a current path through said header switch such that said power supply signal supplied to said target bit cell means during said write operation is controlled by both said header bias signal and said footer bias signal.

17. A method of operating memory circuitry comprising the steps of:

storing within a plurality of bit cells respective data bits;

writing data bits to target bit cells of said plurality of bit cells during a write operation; and using write assist circuitry to lower a power supply signal supplied to said target bit cells during said write operation; wherein said write assist circuitry comprises:

a plurality of switches connected in series between a first power supply rail having a first power supply signal level and a second power supply rail having a second power supply signal level, said plurality of switches including a header switch having a header gate input and a footer switch having a footer gate input;

header bias circuitry for generating a header bias signal supplied to said header gate input during said write operation; and footer bias circuitry for generating a footer bias signal supplied to said footer gate input during said write operation;

said header bias signal is an analog signal with a signal level intermediate between said first power signal level and said second power supply signal level;

said footer bias signal is an analog signal with a signal level intermediate between said first power supply signal level and said second power supply signal level; and during said write operation said target bit cells are supplied with power via a current path through said header switch such that said power supply signal supplied to said target bit cells during said write operation is controlled by both said header bias signal and said footer bias signal.

\* \* \* \* \*